US012812936B2

(12) United States Patent
Fulford et al.

(10) Patent No.: US 12,812,936 B2
(45) Date of Patent: Nov. 24, 2026

(54) 3D SPACER NANOSHEET FORMATION

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 520 days.

(21) Appl. No.: 18/458,688

(22) Filed: Aug. 30, 2023

(65) Prior Publication Data

US 2025/0081552 A1 Mar. 6, 2025

(51) Int. Cl.

| | |
|---|---|
| ***H10D 62/10*** | (2025.01) |
| ***H10D 30/01*** | (2025.01) |
| ***H10D 30/47*** | (2025.01) |
| ***H10D 62/17*** | (2025.01) |
| ***H10D 84/83*** | (2025.01) |
| ***H10P 50/00*** | (2026.01) |

(52) U.S. Cl.

CPC ......... *H10D 62/122* (2025.01); *H10D 30/017* (2025.01); *H10D 30/471* (2025.01); *H10D 62/235* (2025.01); *H10D 84/83* (2025.01); *H10P 50/691* (2026.01); *H10P 50/73* (2026.01)

(58) Field of Classification Search

CPC ..................... H10D 62/122; H10D 30/47–485

See application file for complete search history.

(56) References Cited

U.S. PATENT DOCUMENTS

| | | | | |
|---|---|---|---|---|
| 9,455,317 | B1 * | 9/2016 | Basker | H10D 30/6735 |
| 2023/0097898 | A1 * | 3/2023 | O'Brien | H10D 62/117 257/401 |
| 2023/0108707 | A1 * | 4/2023 | Gardner | H10D 30/47 257/401 |
| 2024/0178228 | A1 * | 5/2024 | Chiang | H10D 30/6729 |

* cited by examiner

*Primary Examiner* — Britt Hanley
*Assistant Examiner* — Jason James Greaving
(74) *Attorney, Agent, or Firm* — Oblon, McClelland, Maier & Neustadt, L.L.P.

(57) ABSTRACT

A semiconductor device is provided. The semiconductor device includes a pair of channel structures each configured to have a current direction along a first direction substantially parallel to a working surface of a substrate. The semiconductor device also includes source/drain (S/D) structures on opposing sides of the pair of channel structures along the first direction. The semiconductor device further includes a gate structure between the pair of channel structures. The pair of channel structures includes two-dimensional (2D) semiconductor material oriented substantially perpendicular to the working surface of the substrate.

20 Claims, 10 Drawing Sheets

3D SPACER NANOSHEET FORMATION

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of forming the semiconductor device.

According to a first aspect of the disclosure, a semiconductor device is provided. The semiconductor device includes a pair of channel structures each configured to have a current direction along a first direction substantially parallel to a working surface of a substrate. The semiconductor device also includes source/drain (S/D) structures on opposing sides of the pair of channel structures along the first direction. The semiconductor device further includes a gate structure between the pair of channel structures. The pair of channel structures includes two-dimensional (2D) semiconductor material oriented substantially perpendicular to the working surface of the substrate.

In some embodiments, the pair of channel structures each includes one or more monolayers of the 2D semiconductor material. The one or more monolayers are stacked in a second direction substantially parallel to the working surface of the substrate.

In some embodiments, the 2D semiconductor material includes at least one selected from the group consisting of a hexagonal boron nitride, a carbon-based material, a semiconducting oxide and a metal chalcogenide.

In some embodiments, the carbon-based material includes graphene. The semiconducting oxide includes at least one selected from the group consisting of ZnO, CdO and $In_2O_3$. The metal chalcogenide includes at least one selected from the group consisting of $WS_2$, $WSe_2$, $WTe_2$, $MoS_2$, $MoSe_2$, $MoTe_2$, $HfS_2$, $ZrS_2$, $TiS_2$, GaSe, InSe, SnS and $TiS_3$.

In some embodiments, the gate structure is fully surrounded by an enclosure formed of the pair of channel structures and the S/D structures in a horizontal plane substantially parallel to the working surface of the substrate.

In some embodiments, a pair of inner spacers are positioned on opposing sides of the gate structure along the first direction and each positioned between the gate structure and a respective S/D structure of the S/D structures.

In some embodiments, the gate structure includes a gate metal and a pair of gate dielectrics. The pair of gate dielectrics are positioned on opposing sides of the gate metal in a second direction substantially parallel to the working surface of the substrate.

In some embodiments, a base is positioned immediately below and being in direct contact with the pair of channel structures. The base includes a dielectric material.

In some embodiments, the pair of channel structures each has a shape of a nanosheet extending substantially perpendicular to the working surface of the substrate.

In some embodiments, the nanosheet has a first dimension of 1-15 nm in the first direction. The nanosheet has a second dimension of 0.1-3.0 nm in a second direction substantially parallel to the working surface of the substrate. The nanosheet has a third dimension of 1-15 nm in a third direction substantially perpendicular to the working surface of the substrate.

In some embodiments, a first ratio of the second dimension to the first dimension is 0.05-0.3. A second ratio of the second dimension to the third dimension is 0.05-0.3.

According to a second aspect of the disclosure, a method of manufacturing a semiconductor device is provided. The method includes forming a pair of channel structures each configured to have a current direction along a first direction substantially parallel to a working surface of a substrate. The pair of channel structures include two-dimensional (2D) semiconductor material oriented substantially perpendicular to the working surface of the substrate. Source/drain (S/D) structures are formed on opposing sides of the pair of channel structures along the first direction. A gate structure is formed between the pair of channel structures.

In some embodiments, a shell structure is formed around a core structure. The shell structure includes the 2D semiconductor material.

In some embodiments, the shell structure is directionally etched to form the pair of channel structures.

In some embodiments, a pair of inner spacers are formed on opposing sides of the core structure after directionally etching the shell structure.

In some embodiments, the core structure is replaced with the gate structure.

In some embodiments, the shell structure is formed by forming one or more monolayers of the 2D semiconductor material on a sidewall of the core structure.

In some embodiments, a dielectric layer is formed on a base. The base includes dielectric material. The dielectric layer is directionally etched to form the core structure.

In some embodiments, the 2D semiconductor material includes at least one selected from the group consisting of a hexagonal boron nitride, a carbon-based material, a semiconducting oxide and a metal chalcogenide.

In some embodiments, the carbon-based material includes graphene. The semiconducting oxide includes at least one selected from the group consisting of ZnO, CdO and $In_2O_3$. The metal chalcogenide includes at least one selected from the group consisting of $WS_2$, $WSe_2$, $WTe_2$, $MoS_2$, $MoSe_2$, $MoTe_2$, $HfS_2$, $ZrS_2$, $TiS_2$, GaSe, InSe, SnS and $TiS_3$.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
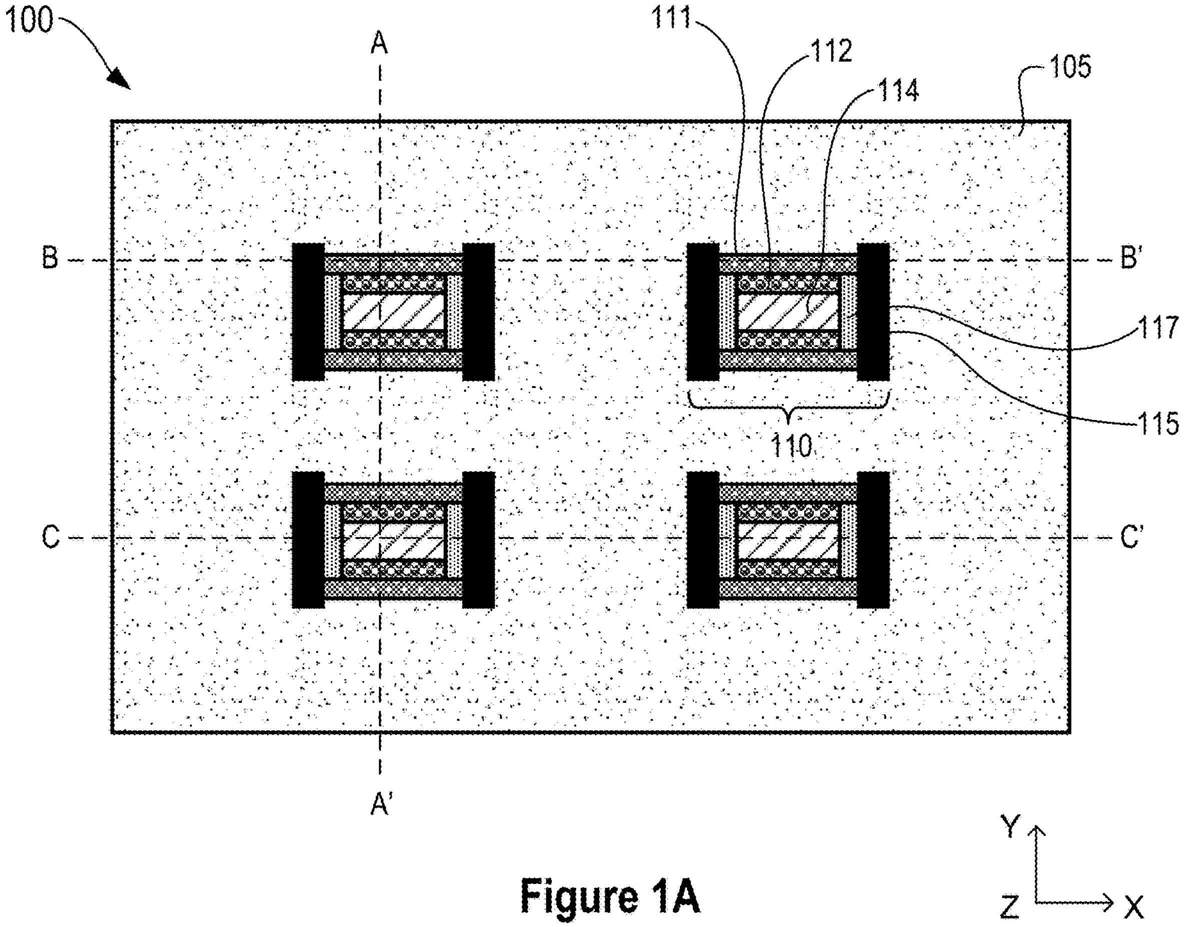
FIG. 1A shows a top view of a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views.

Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

3D integration, i.e. the vertical stacking of multiple devices, arms to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein utilize 3D spacer nanosheet formation to create precise nanosheet channels. The number of device layers and device geometries are not limited for the 3D spacer nanosheet formation. Perfect self-alignment can be achieved in the high k and gate electrode regions. 3D channels may be controlled to monolayer precision using atomic layer deposition of the conductive oxide or 2D channel material. Techniques herein allow 3D devices to be built with a minimum number of masking steps.

Figure 1B:
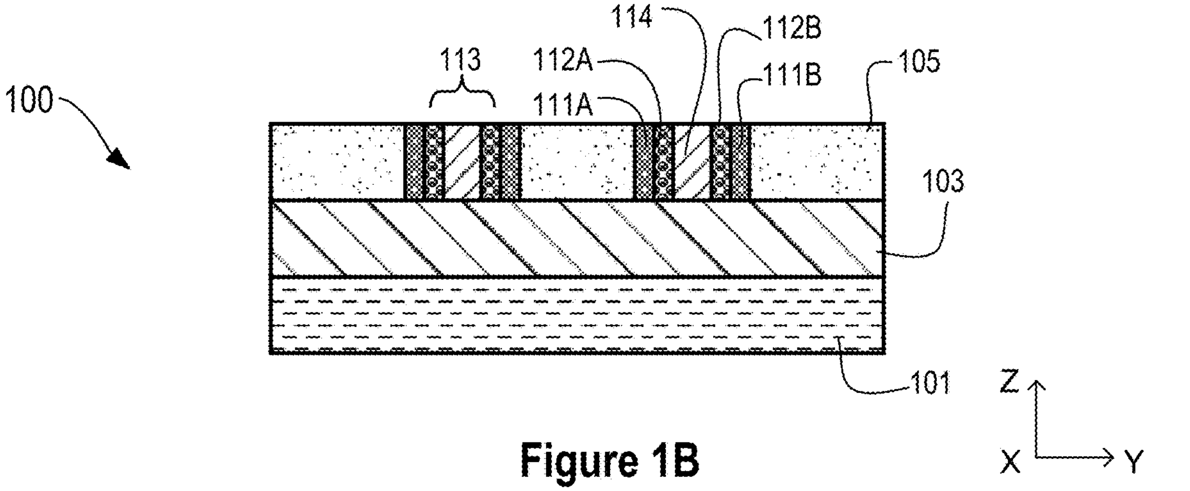
FIGS. 1B, 1C and 1D respectively show vertical cross-sectional views taken along line cuts AA', BB' and CC' in accordance with some embodiments of the present disclosure.
Figure 1C:
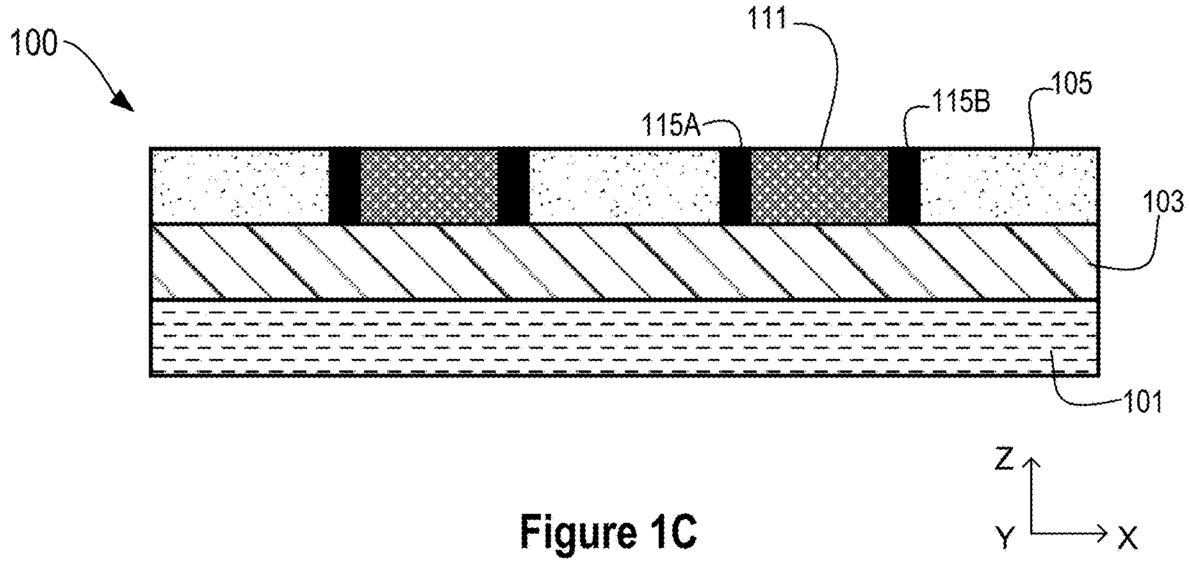
Figure 1D:
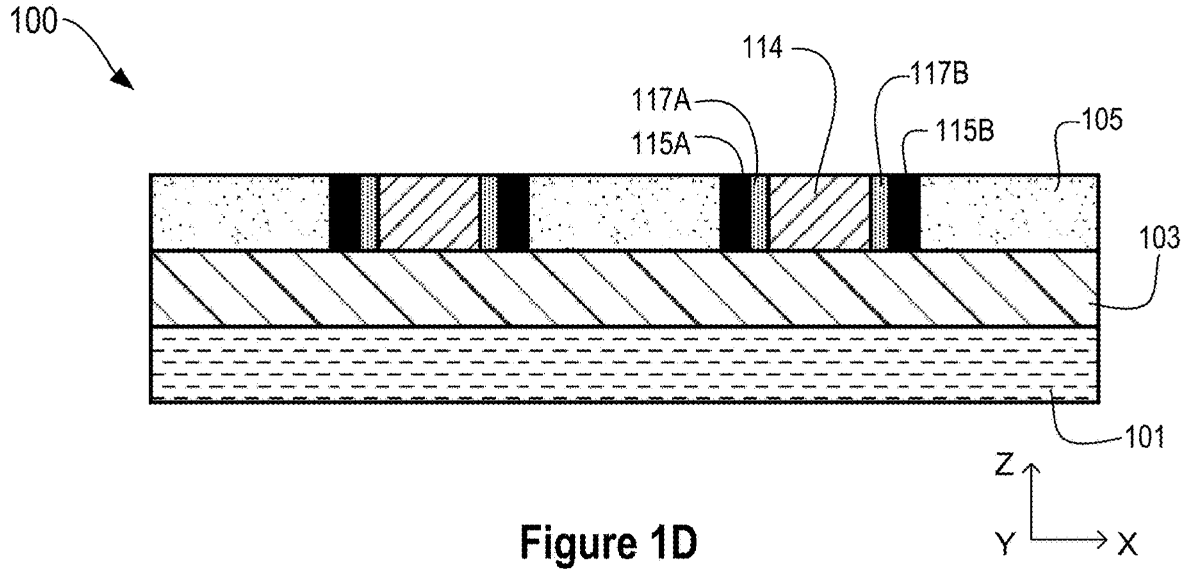

FIG. 1A shows a top view of a semiconductor device 100 in accordance with one embodiment of the present disclosure. FIGS. 1B, 1C and 1D respectively show vertical cross-sectional views of the semiconductor device 100 taken along line cuts AA', BB' and CC' in accordance with some embodiments of the present disclosure.

As shown, the semiconductor device 100 includes one or more (e.g. four) transistors arranged in the XY plane. Consider a transistor 110 for example. The transistor 110 includes a pair of channel structures 111 and source/drain (S/D) structures 115 on opposing sides of the pair of channel structures 111 along the X direction. Therefore, each channel structure (e.g. 111A and 111B) of the pair of channel structures 111 is configured to have a current direction along the X direction. The transistor 110 also includes a gate structure 113 between the pair of channel structures 111.

Particularly, the pair of channel structures 111 can include two-dimensional (2D) semiconductor material oriented perpendicular to the XY plane. "2D semiconductor material" as used in the present disclosure generally refers to a semiconductor material with a thickness on the atomic scale, typically in the form of a single layer (or monolayer) of atoms, or a plurality of layers of atoms for example being 1-100 angstroms thick, preferably 3-50 angstroms thick, preferably 5-30 angstroms thick, preferably 8-20 angstroms thick, preferably 10-15 angstroms thick.

Note that such a monolayer or a stack of monolayers can have large surface areas and high surface-to-volume ratios. Moreover, multiple monolayers can be stacked to form a layered crystal structure with strong in-plane bonds and show layer-dependent properties. Hence, a 2D semiconductor material can have a high degree of anisotropy and thus have distinct chemical properties from traditional (e.g. bulk) semiconductor materials. For example, a 2D semiconductor material need not be formed by epitaxial growth (or epitaxial deposition) and yet may be crystalline. Stacking of such monolayers are not necessarily limited or constrained by conventional lattice-matching requirements. Ergo, a 2D semiconductor material can be formed on a non-crystalline layer, such as a dielectric layer or a dielectric substrate. A 2D semiconductor material can be formed by techniques including, but not limited to, atomic layer deposition (ALD), chemical vapor deposition (CVD), chemical exfoliation, hydrothermal synthesis and thermal decomposition. Additionally, a 2D semiconductor material can exhibit distinct optical and/or electrical properties from traditional semiconductor materials, such as having higher carrier mobility than a silicon- or germanium-based semiconductor material.

For example, a 2D semiconductor material may include a transition-metal dichalcogenide (TMDC). A TMDC can have a chemical formula of $MX_2$, where M includes a transition metal from Group VI, Group V or Group VI of the periodic table while X includes a chalcogen such as sulfur (S), selenium (Se) or tellurium (Te). More specifically, a 2D semiconductor material can include a W-based 2D material (e.g. $WS_2$, $WSe_2$ or $WTe_2$), a Mo-based 2D material (e.g. $MoS_2$, $MoSe_2$ or $MoTe_2$), $HfS_2$, $ZrS_2$, $TiS_2$ or the like. A 2D semiconductor material may also include a different kind of metal chalcogenides, such as a metal monochalcogenide (e.g. GaSe, InSe or SnS), a metal trichalcogenide (e.g. $TiS_3$) or the like. Further, a 2D semiconductor material can include a carbon-based material (e.g. graphene), a semiconducting oxide (e.g. ZnO, CdO or $In_2O_3$), hexagonal boron nitride (h-BN) or the like.

Herein, the pair of channel structures 111 can each include one or more monolayers of the 2D semiconductor material stacked in the Y direction. Accordingly, the pair of channel structures 111 can each have the shape of a nanosheet extending in the XZ plane or oriented perpendicular to the XY plane. The nanosheet can have a first dimension of 1-15 nm in the X direction, a second dimension of 0.1-3.0 nm in the Y direction, and a third dimension of 1-15 nm in the Z direction. A first ratio of the second dimension to the first dimension can be 0.01-0.30, e.g. 0.01, 0.05, 0.10, 0.12, 0.15, 0.18, 0.20, 0.25, 0.30, or any value therebetween. A second ratio of the second dimension to the third dimension can be 0.01-0.30, e.g. 0.01, 0.05, 0.10, 0.12, 0.15, 0.18, 0.20, 0.25, 0.30, or any value therebetween. That is to say, the nanosheet is relatively thin in the Y direction while extending in the XZ plane. Additionally, a third ratio of the first dimension to the third dimension can be 0.2-5.0, e.g. 0.2, 0.3, 0.4, 0.5, 0.6, 0.7, 0.8, 0.9 1.0, 1.5, 2.0, 2.5, 3.0, 3.5, 4.0, 4.5, 5.0 or any value therebetween.

Particularly, the first dimension can be 1 nm, 2 nm, 3 nm, 4 nm, 5 nm, 6 nm, 7 nm, 8 nm, 9 nm, 10 nm, 11 nm, 12 nm, 13 nm, 14 nm, 15 nm or any value therebetween. The second dimension can be 0.1 nm, 0.2 nm, 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm, 2.5 nm, 2.6 nm, 2.7 nm, 2.8 nm, 2.9 nm, 3.0 nm or any value therebetween. The third dimension can be 1 nm, 2 nm, 3 nm, 4 nm, 5 nm, 6 nm, 7 nm, 8 nm, 9 nm, 10 nm, 11 nm, 12 nm, 13 nm, 14 nm, 15 nm or any value therebetween.

In conventional technology, a nanosheet typically extends horizontally. That is, a conventional nanosheet has a smallest dimension in a vertical direction perpendicular to a working surface of a substrate. By contrast in the present disclosure, the nanosheet can be a vertical nanosheet or a Pi/2 rotated nanosheet. That is, the pair of channel structures 111 each have a smallest dimension in the Y direction, instead of in the Z direction. As a result, a large current flow can be achieved on both sides of the nanosheet, thus eliminating the need for GAA transistor structure. Additionally, in some conventional examples, a semiconductor bar, wire or rod may be formed to function as a channel. However, a conventional semiconductor bar, wire or rod is different from the nanosheet described herein and cannot achieve the same advantage of having a large current flow on both sides.

Still referring to FIGS. 1A-1D, the gate structure 113 includes a gate metal 114 and a pair of gate dielectrics 112 (e.g. 112A and 112B) positioned on opposing sides of the gate metal 114 along the Y direction. Therefore, the gate structure 113 is not a gate-all-around structure, but a common gate for the pair of channel structures 111. Herein, the gate structure 113 is fully surrounded by an enclosure formed of the pair of channel structures 111 and the S/D structures 115 in the XY plane.

In some embodiments, the pair of gate dielectrics 112 each include at least one dielectric material such as a high-k dielectric while the gate metal 114 includes at least one metal material such as a work function metal (WFM). In other words, while the gate metal 114 is shown as a single material, the gate metal 114 may be made up of two or more layers of metals having different work functions. Similarly, the pair of gate dielectrics 112 may each be made up of two or more layers of dielectric materials.

Additionally, the semiconductor device 100 can include a substrate 101 having a semiconductor material and optionally a base 103 that is disposed between the substrate 101 and the transistor 110. In this example, the pair of channel structures 111 each include a conductive oxide (also referred to as a semiconducting oxide), and the base 103 can include a dielectric material.

The semiconductor device 100 can include dielectric materials, e.g. as shown by 103, 105, 112, and 117. The dielectric materials may also be referred to as isolation structures, isolation layers, diffusion breaks, inner spacers, gate dielectrics, capping layers, etc. depending on functions thereof. For example, the dielectric material 117 can separate the gate structure 113 from the S/D structures 115 and thus be referred to as inner spacers or a pair of inner spacers. Additionally, some of the dielectric materials may include identical materials or may include different materials. For example, the dielectric materials 103 and 117 may include a same material.

Of course it should be understood that the semiconductor device 100 can include any number of transistors, such as the transistor 110 and the like, arranged in the XY plane over the substrate 101.

Figure 2:
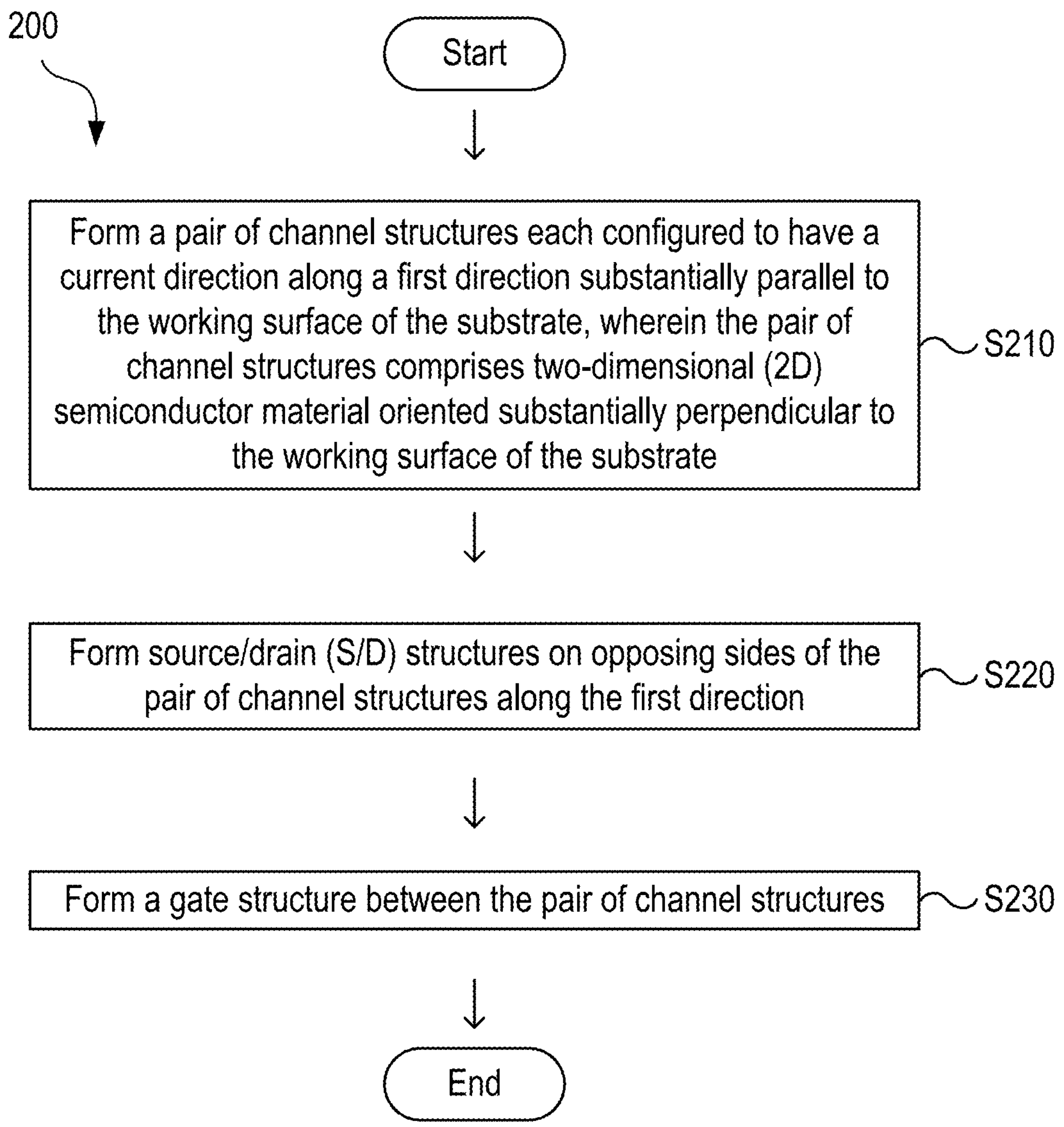
FIG. 2 shows a flow chart of a process for manufacturing a semiconductor device, in accordance with some embodiments of the present disclosure.

FIG. 2 shows a flow chart of a process 200 for manufacturing a semiconductor device, such as the semiconductor device 100 and the like, in accordance with some embodiments of the present disclosure. At Step S210, a pair of channel structures are formed and are each configured to have a current direction along a first direction substantially parallel to a working surface of a substrate. The pair of channel structures include two-dimensional (2D) semiconductor material oriented substantially perpendicular to the working surface of the substrate. At Step S220, source/drain (S/D) structures are formed on opposing sides of the pair of channel structures along the first direction. At Step S230, a gate structure is formed between the pair of channel structures.

FIGS. 3, 4, 5A, 5B, 6A, 6B, 7, 8, 9, 10, 11A, 11B, 11C and 12 show top views or vertical cross-sectional views of a semiconductor device 300 at various intermediate steps of manufacturing, in accordance with some embodiments of the present disclosure.

Figure 3:
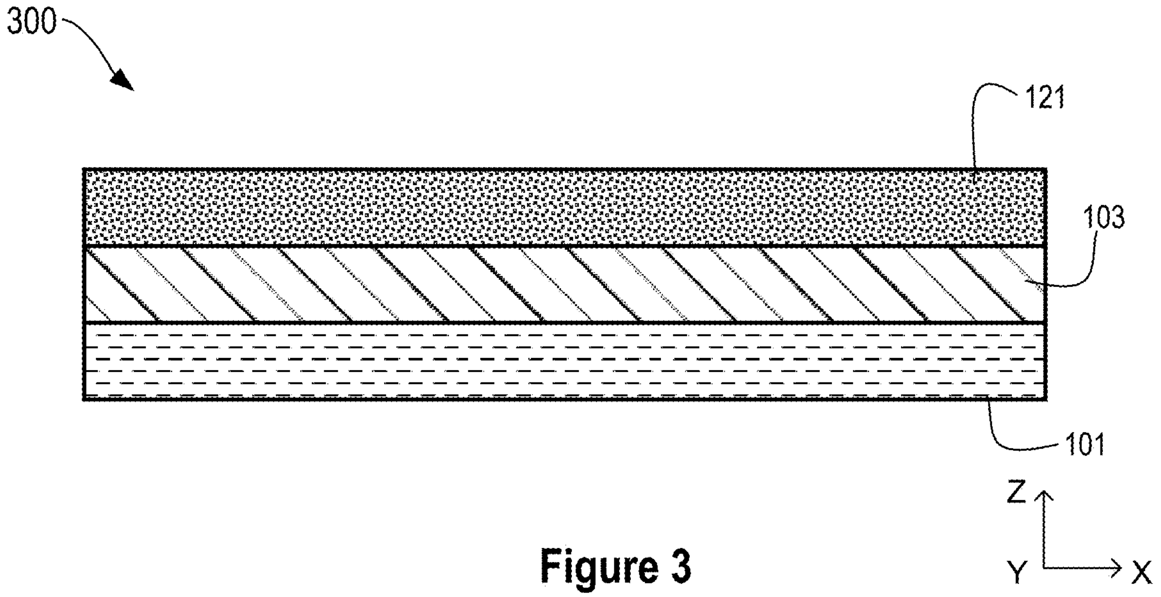
FIGS. 3, 4, 5A, 5B, 6A, 6B, 7, 8, 9, 10, 11A, 11B, 11C and 12 show top views or vertical cross-sectional views of a semiconductor device at various intermediate steps of manufacturing, in accordance with some embodiments of the present disclosure.

As shown in FIG. 3, the semiconductor device 300 includes the substrate 101 and the base 103 formed thereon. A dielectric layer 121 is formed on the base 103 which can include a dielectric material.

Figure 4:
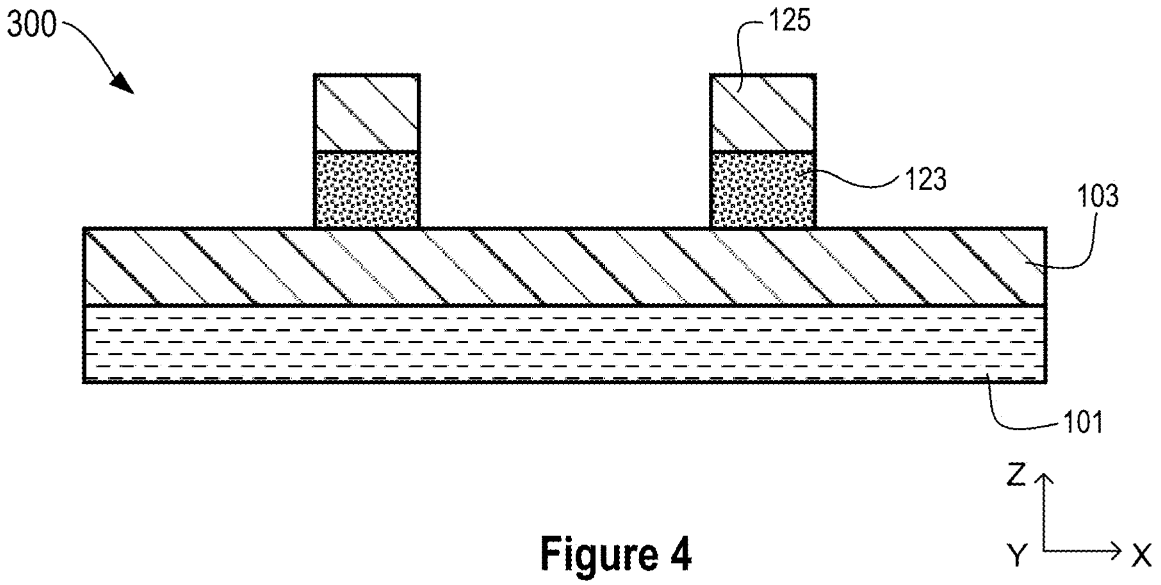

In FIG. 4, the dielectric layer 121 is directionally etched using a mask 125 to form one or more core structures 123 that are separated from each other.

Figure 5A:
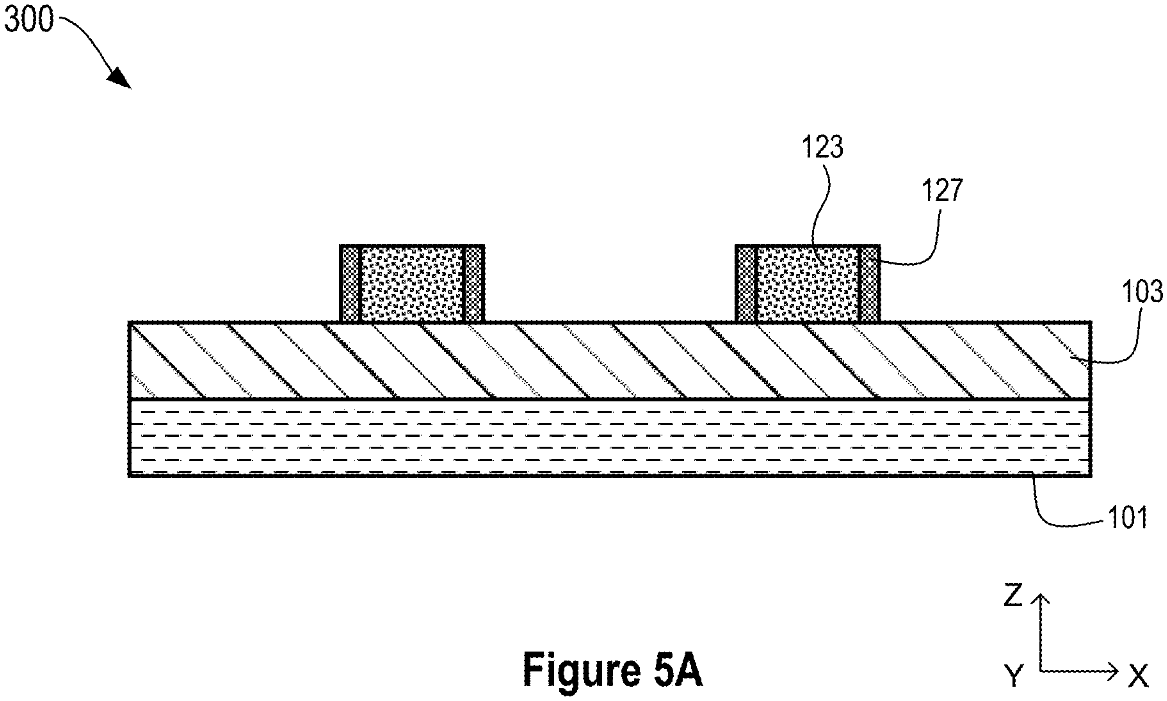
Figure 5B:
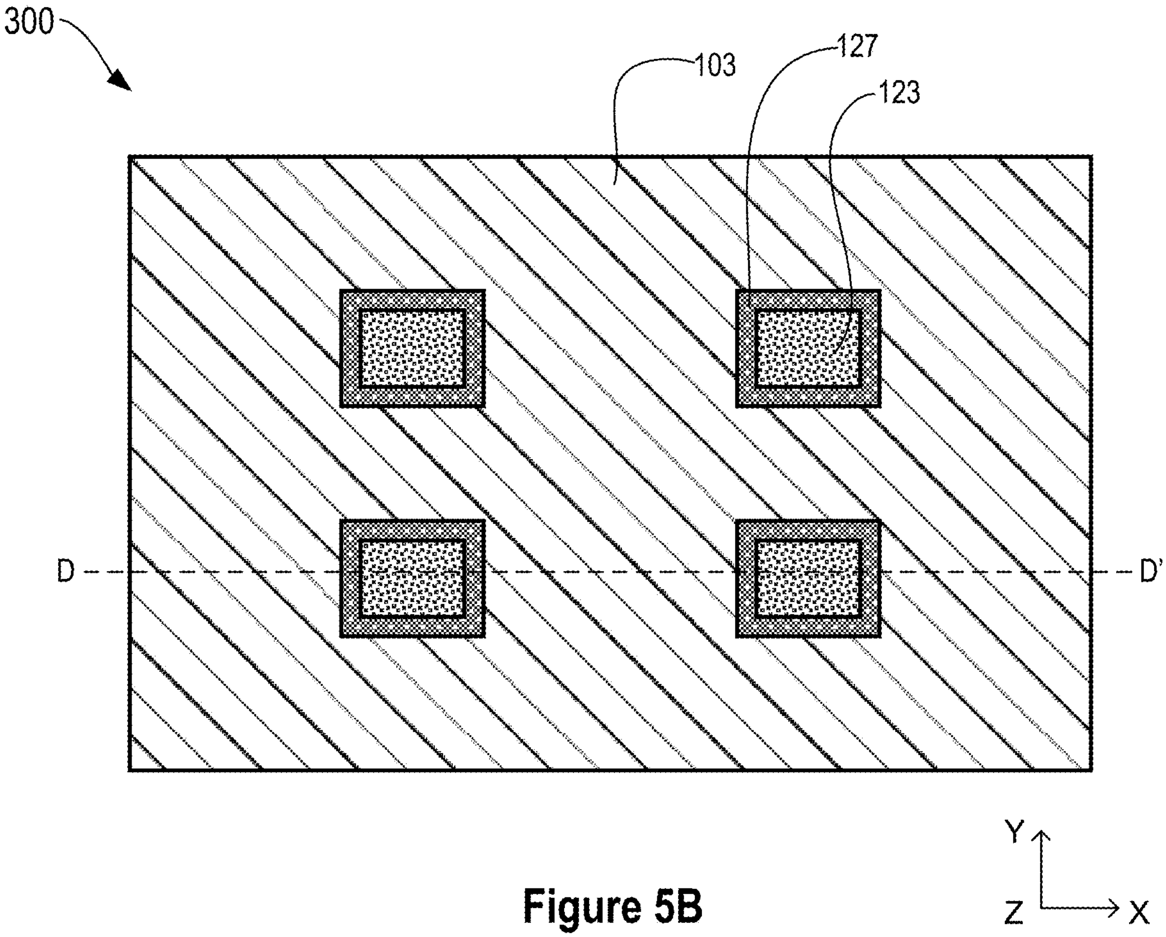

FIG. 5A shows a vertical cross-sectional view taken along the line cut DD' in FIG. 5B. As shown, a respective shell structure 127 is formed around each core structure 123 for example by selective deposition. The mask 125 is removed. Shell structures 127 each include a 2D semiconductor material. Accordingly, the shell structures 127 can be formed by forming one or more monolayers of the 2D semiconductor material on sidewalls of the core structures 123. In this example, the shell structures 127 include a conductive oxide (also referred to as a semiconducting oxide) and thus is also referred to as a spacer or a conductive oxide spacer which is now defined as a future channel region of a transistor.

Figure 6A:
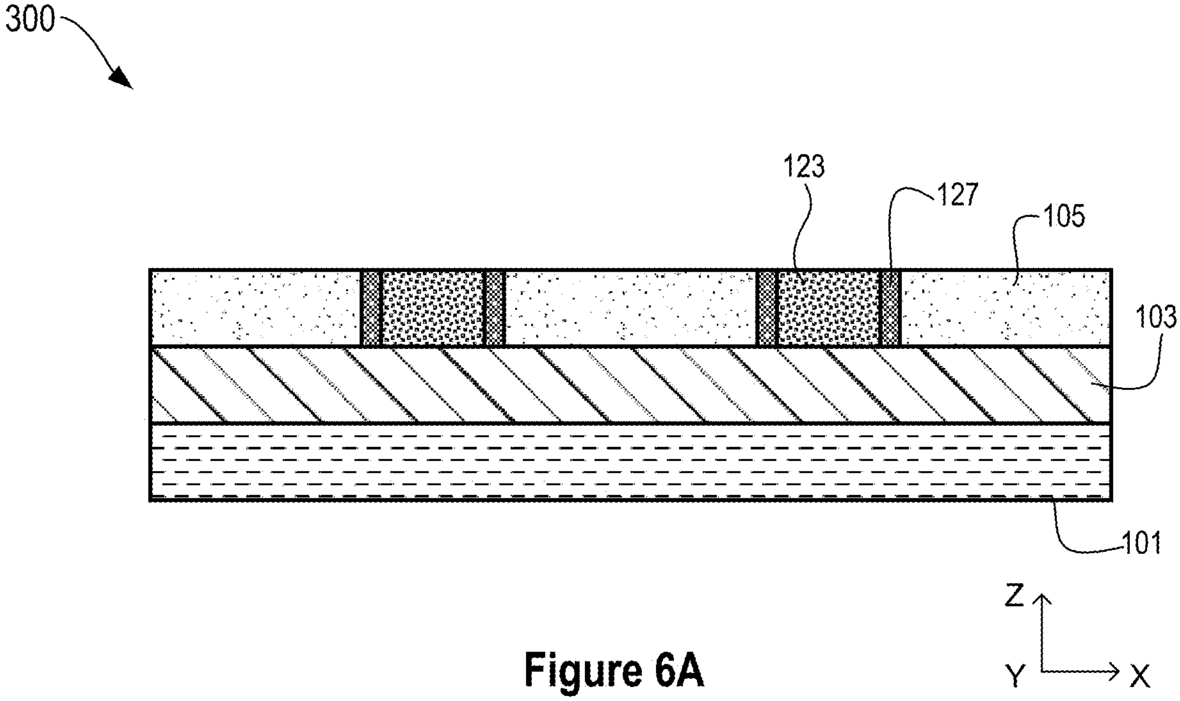
Figure 6B:
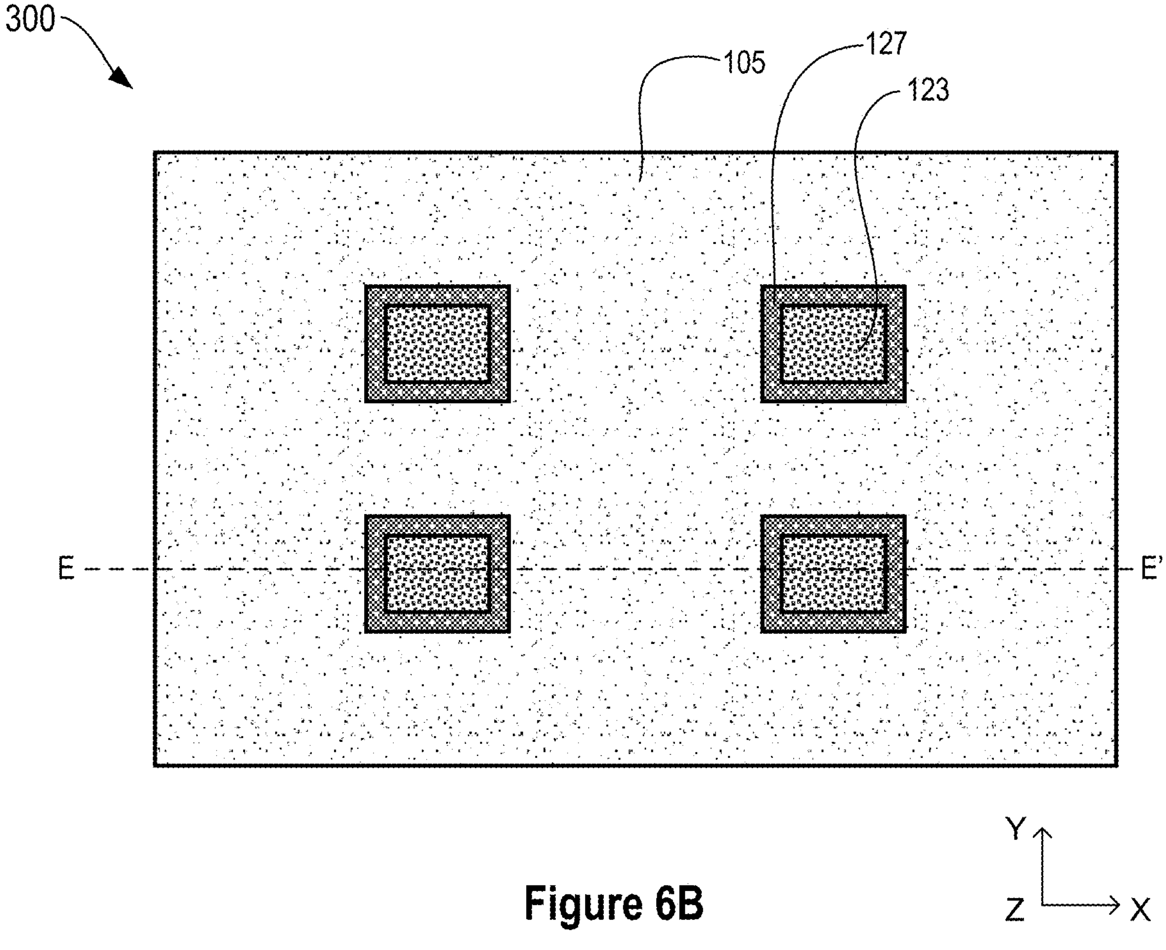

FIG. 6A shows a vertical cross-sectional view taken along the line cut EE' in FIG. 6B. As shown, the dielectric material 105 is formed on the base 103 as isolation deposition and planarized by chemical-mechanical polishing (CMP) for example.

Figure 7:
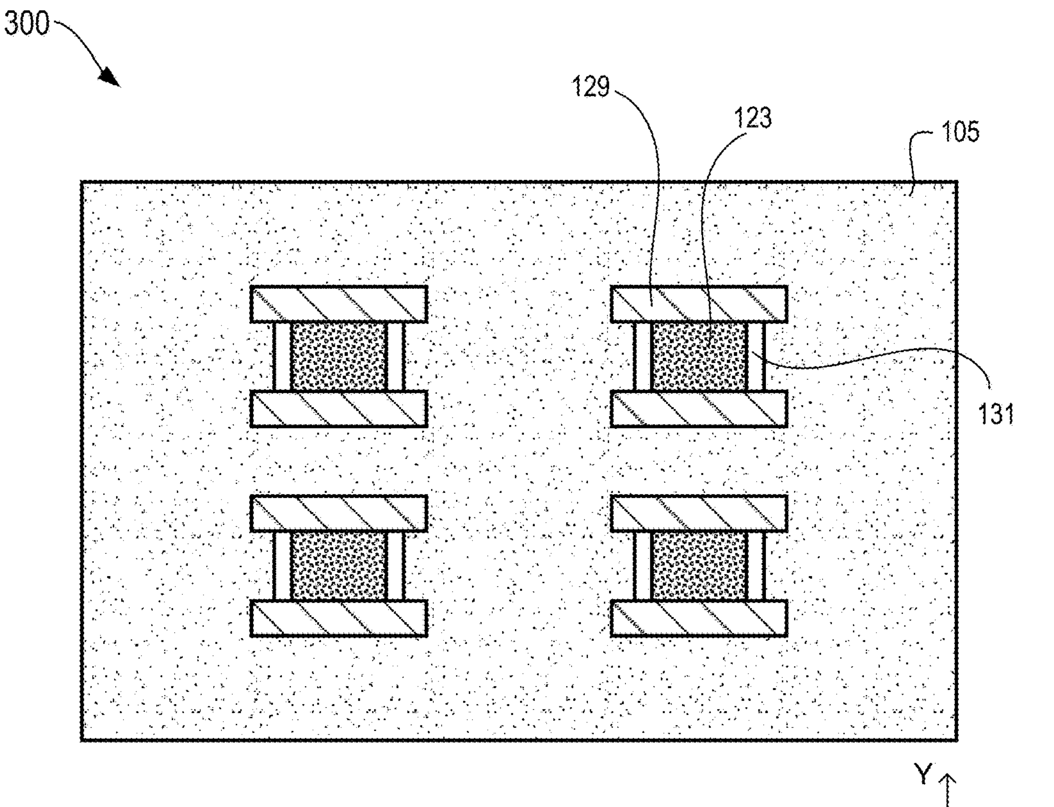
Figure 8:
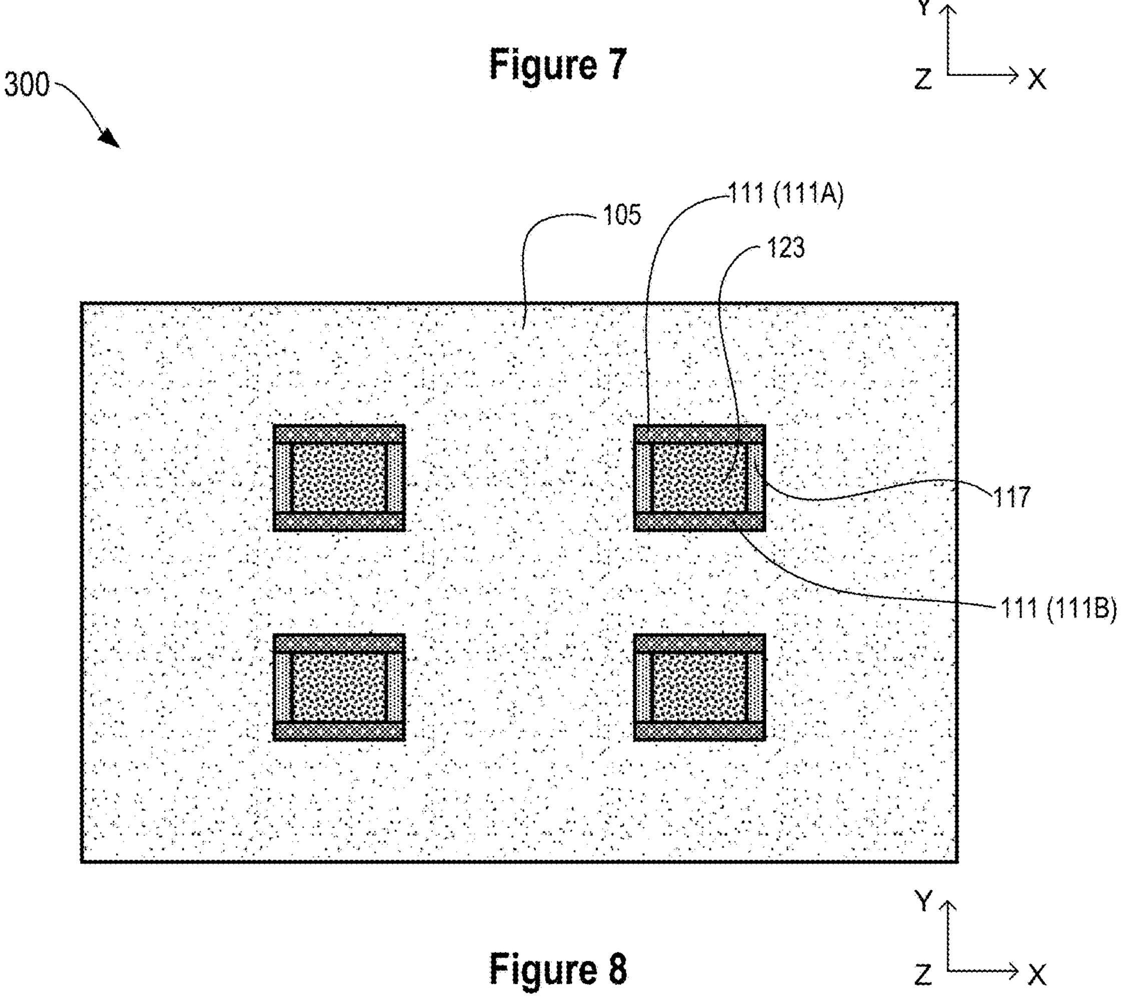

In FIG. 7, the shell structures 127 are directionally etched by a mask 129 to form the pair of channel structures 111 (not visible for being underneath the mask 129; shown in FIG. 8). Additionally, portions of the shell structures 127 are removed to form openings 131. In this example, a dual channel configuration along the X direction is shown for illustrative purposes.

In FIG. 8, the openings 131 are filled with inner spacers (e.g. 117). For example, the dielectric material 117 can be deposited in the openings 131 and then planarized. Subsequently, the core structures 123 can be replaced with gate structures 113.

Figure 9:
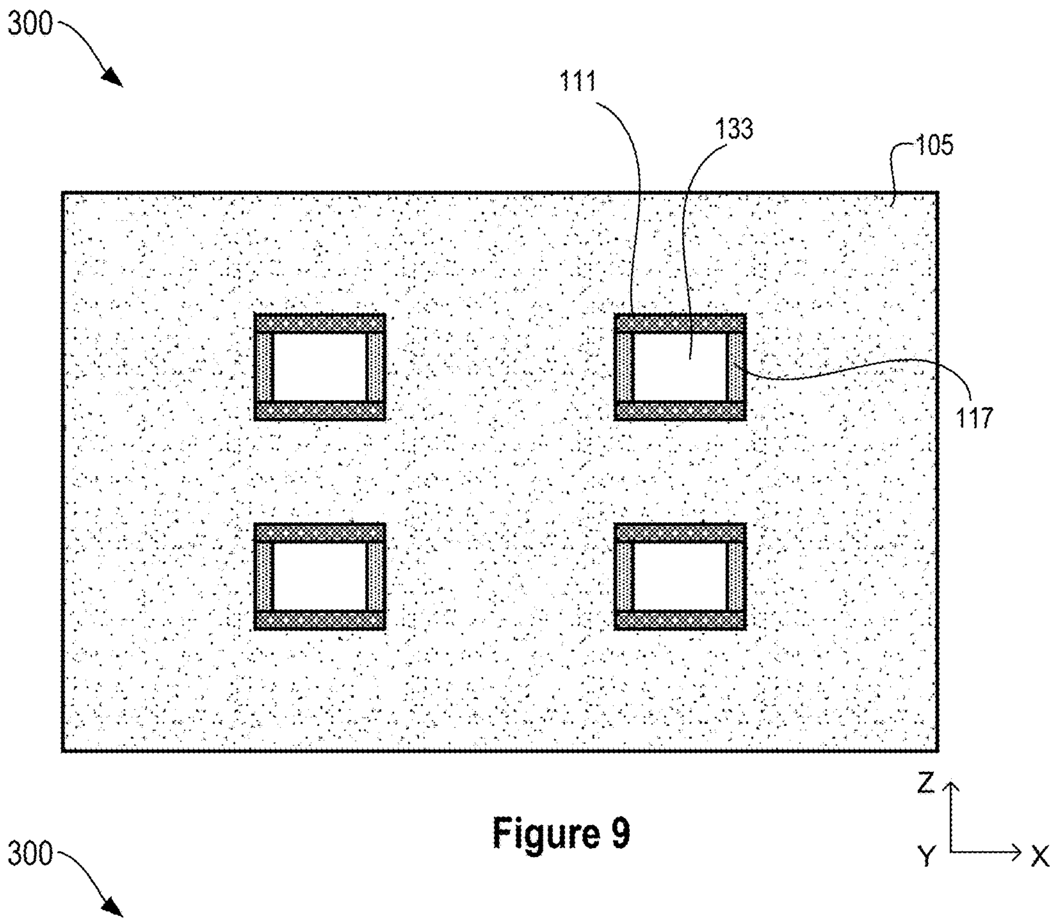

In FIG. 9, the core structures 123 are selectively removed to form openings 133.

Figure 10:
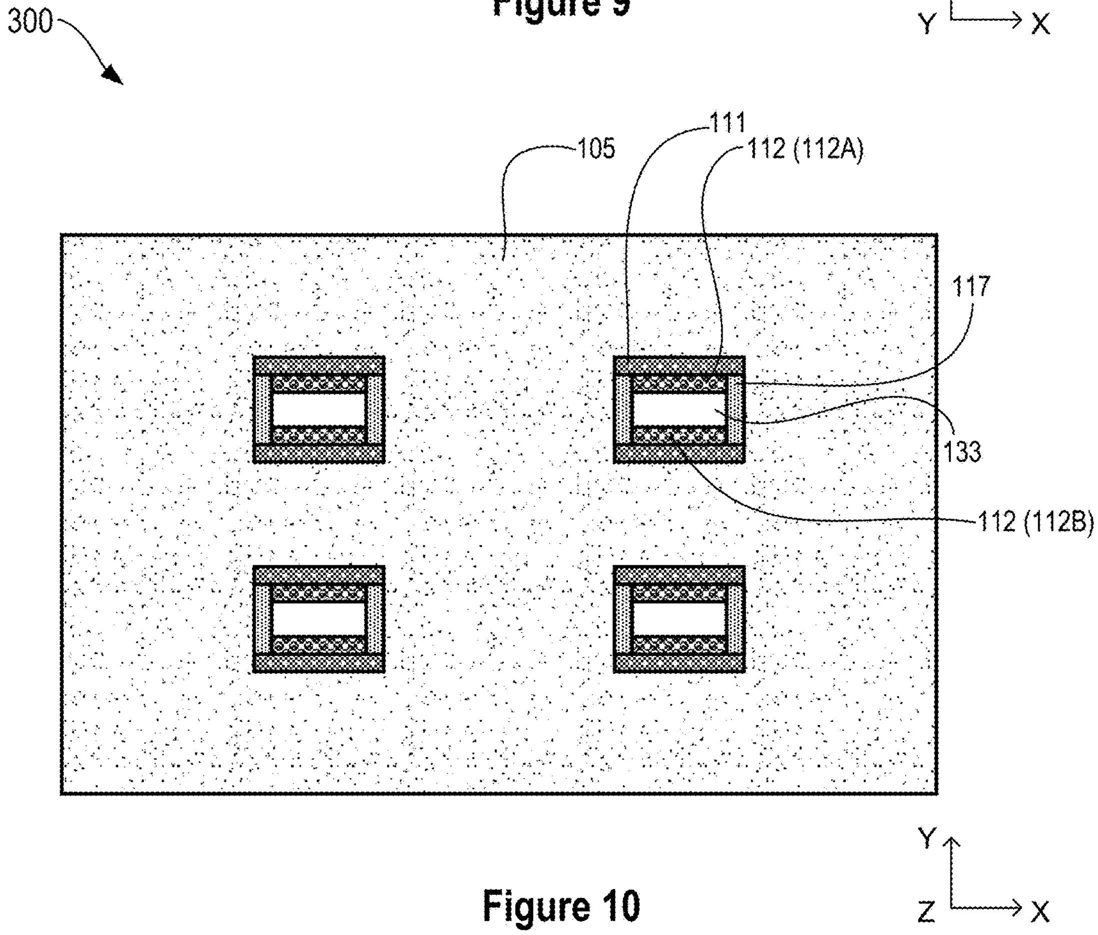

In FIG. 10, the pair of gate dielectrics 112 (e.g. 112A and 112B) are formed, for example by depositing high-k dielectric material on the pair of channel structures 111 selectively (shown in this example) or non-selectively (not shown). In the case of non-selective deposition, the high-k dielectric material will also be formed on sidewalls of the dielectric material 117. A mask-based directional etching process can then be executed to remove portions of the high-k dielectric material deposited on the sidewalls of the dielectric material 117.

Figure 11A:
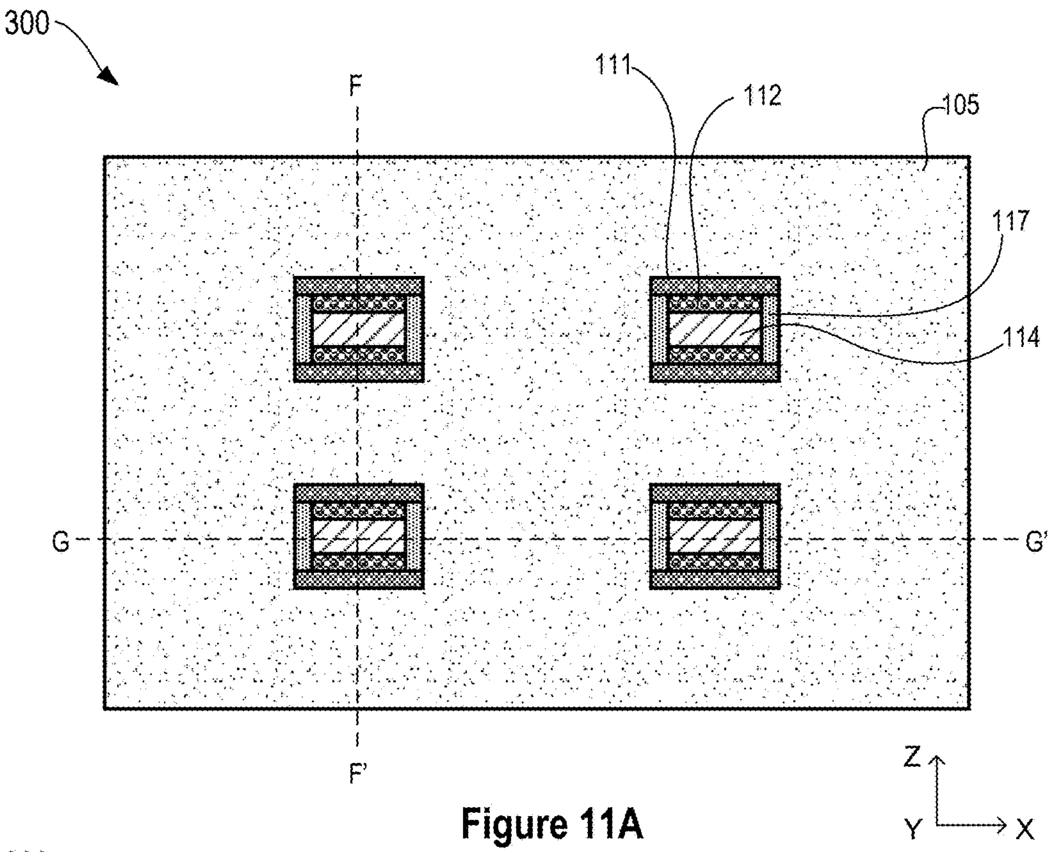
Figure 11B:
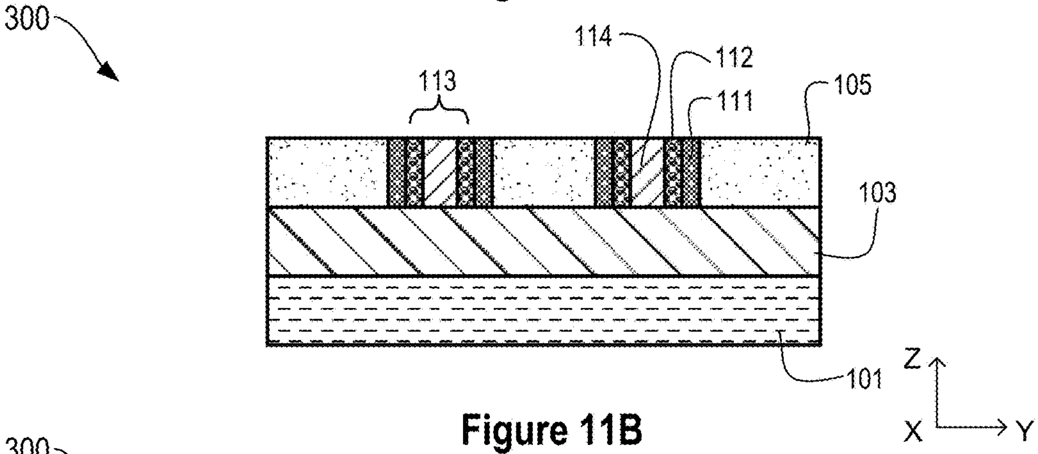
Figure 11C:
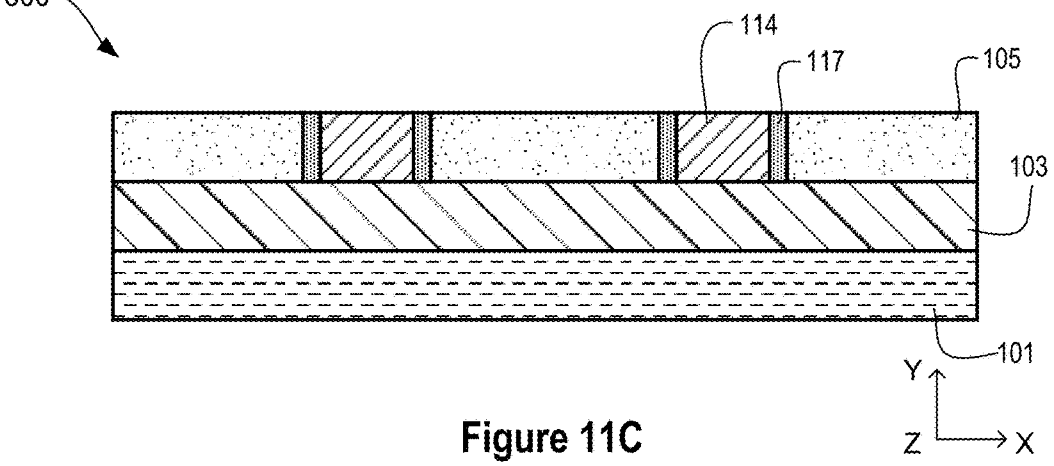

FIGS. 11B and 11C respectively show vertical cross-sectional views taken along the line cuts FF' and GG' in FIG. 6A. As shown, the gate metal 114 is formed between the pair of gate dielectrics 112 in the openings 133. As a result, the gate structure 113 is formed.

Figure 12:
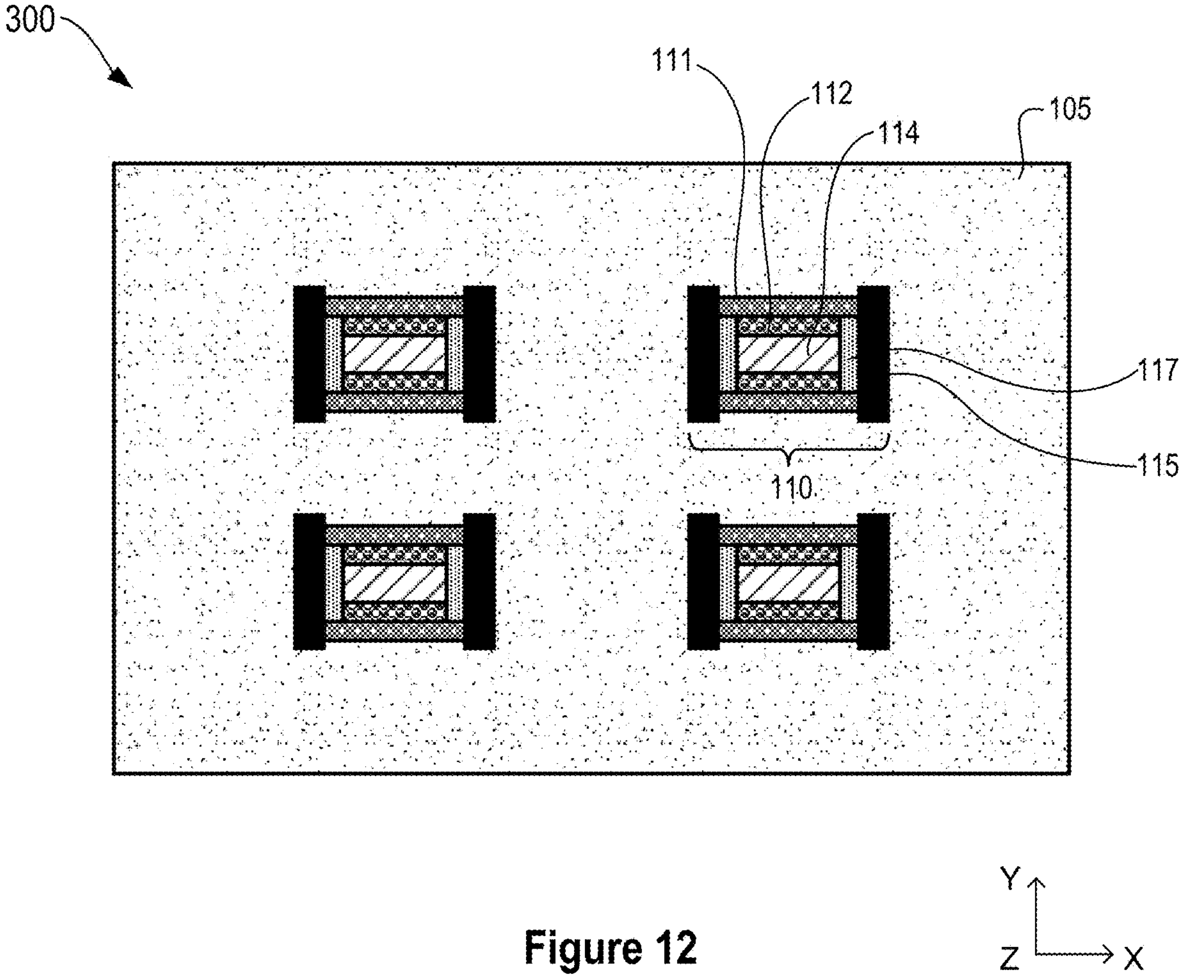

In FIG. 12, the S/D structures 115 are formed on opposing sides of the pair of channel structures 11 along the X direction. For example, a mask can be used to directionally etch the dielectric material 105 to define S/D regions which will then be filled with S/D metal, followed by CMP. S/D hookup (e.g. a metal contact) may also be provided. Consequently, the transistor 110 is formed. The semiconductor device 300 can become the semiconductor device 100 in FIGS. 1A-1D.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:

a pair of channel structures each configured to have a current direction along a first direction substantially parallel to a working surface of a substrate;

source/drain (S/D) structures on opposing sides of the pair of channel structures along the first direction; and a gate structure between the pair of channel structures, wherein the pair of channel structures comprises two-dimensional (2D) semiconductor material oriented substantially perpendicular to the working surface of the substrate, and the gate structure is fully surrounded by an enclosure formed of the pair of channel structures and the S/D structures in a horizontal plane substantially parallel to the working surface of the substrate.

2. The semiconductor device of claim 1, wherein:

the pair of channel structures each includes one or more monolayers of the 2D semiconductor material, the one or more monolayers stacked in a second direction substantially parallel to the working surface of the substrate.

3. The semiconductor device of claim 1, wherein:

the 2D semiconductor material includes at least one selected from the group consisting of a hexagonal boron nitride, a carbon-based material, a semiconducting oxide and a metal chalcogenide.

4. The semiconductor device of claim 3, wherein:

when the 2D semiconductor material includes the carbon-based material, the carbon-based material includes graphene, when the 2D semiconductor material includes the semiconducting oxide, the semiconducting oxide includes at least one selected from the group consisting of ZnO, CdO and $In_2O_3$, and when the 2D semiconductor material includes the metal chalcogenide, the metal chalcogenide includes at least one selected from the group consisting of $WS_2$, $WSe_2$, $WTe_2$, $MoS_2$, $MoSe_2$, $MoTe_2$, $HfS_2$, $ZrS_2$, $TiS_2$, GaSe, InSe, SnS and $TiS_3$.

5. The semiconductor device of claim 1, further comprising:

a pair of inner spacers positioned on opposing sides of the gate structure along the first direction and each positioned between the gate structure and a respective S/D structure of the S/D structures.

6. The semiconductor device of claim 1, wherein:

the gate structure comprises a gate metal and a pair of gate dielectrics, and the pair of gate dielectrics are positioned on opposing sides of the gate metal in a second direction substantially parallel to the working surface of the substrate.

7. The semiconductor device of claim 1, further comprising:

a base positioned immediately below and being in direct contact with the pair of channel structures, the base comprising a dielectric material.

8. The semiconductor device of claim 1, wherein:

the pair of channel structures each has a shape of a nanosheet extending substantially perpendicular to the working surface of the substrate.

9. The semiconductor device of claim 8, wherein:

the nanosheet has a first dimension of 1-15 nm in the first direction, the nanosheet has a second dimension of 0.1-3.0 nm in a second direction substantially parallel to the working surface of the substrate, and the nanosheet has a third dimension of 1-15 nm in a third direction substantially perpendicular to the working surface of the substrate.

10. The semiconductor device of claim 9, wherein:

a first ratio of the second dimension to the first dimension is 0.05-0.3, and a second ratio of the second dimension to the third dimension is 0.05-0.3.

11. The semiconductor device of claim 1, wherein:

the gate structure comprises a gate metal and a pair of discrete gate dielectrics, and the pair of discrete gate dielectrics are positioned outside the gate metal and on opposing sides of the gate metal in a second direction substantially parallel to the working surface of the substrate.

12. A method of manufacturing a semiconductor device, the method comprising:

forming a pair of channel structures each configured to have a current direction along a first direction substantially parallel to a working surface of a substrate, wherein the pair of channel structures comprises two-dimensional (2D) semiconductor material oriented substantially perpendicular to the working surface of the substrate;

forming source/drain (S/D) structures on opposing sides of the pair of channel structures along the first direction; and forming a gate structure between the pair of channel structures, wherein the gate structure is fully surrounded by an enclosure formed of the pair of channel structures and the S/D structures in a horizontal plane substantially parallel to the working surface of the substrate.

13. The method of claim 12, further comprising:

forming a shell structure around a core structure, the shell structure comprising the 2D semiconductor material.

14. The method of claim 13, further comprising:

directionally etching the shell structure to form the pair of channel structures.

15. The method of claim 14, further comprising:

forming a pair of inner spacers on opposing sides of the core structure after directionally etching the shell structure.

16. The method of claim 13, further comprising:

replacing the core structure with the gate structure.

17. The method of claim 13, further comprising:

forming the shell structure by forming one or more monolayers of the 2D semiconductor material on a sidewall of the core structure.

18. The method of claim 17, further comprising:

forming a dielectric layer on a base, the base comprising dielectric material; and directionally etching the dielectric layer to form the core structure.

19. The method of claim 12, wherein:

the 2D semiconductor material includes at least one selected from the group consisting of a hexagonal boron nitride, a carbon-based material, a semiconducting oxide and a metal chalcogenide.

20. The method of claim 19, wherein:

when the 2D semiconductor material includes the carbon-based material, the carbon-based material includes graphene, when the 2D semiconductor material includes the semiconducting oxide, the semiconducting oxide includes at least one selected from the group consisting of ZnO, CdO and $In_2O_3$, and when the 2D semiconductor material includes the metal chalcogenide, the metal chalcogenide includes at least one selected from the group consisting of $WS_2$, $WSe_2$, $WTe_2$, $MoS_2$, $MoSe_2$, $MoTe_2$, $HfS_2$, $ZrS_2$, $TiS_2$, GaSe, InSe, SnS and $TiS_3$.

* * * * *